United States Patent [19]

Okada

[11] 4,306,198

[45] Dec. 15, 1981

[54] FILTER CIRCUIT

[75] Inventor: Takashi Okada, Yokohama, Japan

[73] Assignee: Sony Corporation, Tokyo, Japan

[21] Appl. No.: 79,079

[22] Filed: Sep. 26, 1979

[30] Foreign Application Priority Data

Sep. 27, 1978 [JP] Japan .................................. 53-118845

[51] Int. Cl.³ .............................................. H03F 3/45
[52] U.S. Cl. .................................... 330/260; 330/294;
330/305; 330/306; 331/116 R; 358/28
[58] Field of Search ............... 330/257, 260, 294, 303,
330/305, 306; 331/116 R; 358/28

[56] References Cited

U.S. PATENT DOCUMENTS 3,743,764 7/1973 Wittmann ............................ 358/28
3,969,682 7/1976 Rossum ............................ 330/260 X

OTHER PUBLICATIONS

Franco, "Use Transconductance Amplifiers to Make Programmable Active Filters", *Electronic Design*, vol. 24, No. 19, pp. 98-101, Sep. 13, 1976.

*Primary Examiner*—James B. Mullins
*Attorney, Agent, or Firm*—Lewis H. Eslinger; Alvin Sinderbrand

[57] ABSTRACT

A filter circuit whose cut-off frequency is easily controlled and which can be manufactured as an integrated circuit. The base electrode of a first transistor is connected to an input terminal by a reactance element, such as a capacitor. Second and third transistors are connected in differential amplifier configuration, and a current source is connected to the common connection of the emitter electrodes thereof. The emitter electrode of the first transistor is connected to the base electrode of the second transistor and the base electrode of the first transistor is connected to the collector electrode of the second transistor. An output terminal is connected to at least one of the collector and emitter electrodes of the first transistor.

6 Claims, 10 Drawing Figures

4,306,198

FILTER CIRCUIT

BACKGROUND OF THE INVENTION

This invention relates to a filter circuit and, more particularly, to a filter circuit whose cut-off frequency is easily controlled and, moreover, which can be constructed as an integrated circuit.

It is conventional to fabricate filter circuits an integrated circuits. For cost effectiveness in manufacturing such integrated circuit filters, it is important that the number of external connections which are needed for proper operation thereof, that is, the number of connecting terminals which must be provided, be minimized. Heretofore, active filters have been manufactured as integrated circuits. However, in typical IC active filters, the resistance values of the various resistive elements often cannot be as high as desired. This results in a non-uniform cut-off frequency. That is, in a particular run of IC active filters, the cut-off frequency of one may differ from that of the other.

Another difficulty in IC active filters is that, since the temperature characteristic of the resistive elements often is less than satisfactory, the cut-off frequency of the filter is, to a significant extent, dependent upon temperature. Thus, the operating characteristics of the IC active filter may become unstable with temperature deviations.

Yet another disadvantage in typical IC active filters is that a low cut-off frequency for a high-pass filter is not easily obtainable because the resistance and capacitance values of the resistive and capacitive elements therein are not as high as desired. That is, limitations on the resistive and capacitive values prevent the high-pass filter from having a relatively low cut-off frequency.

OBJECTS OF THE INVENTION

Therefore, it is an object of the present invention to provide an improved filter circuit which overcomes the aforenoted difficulties and problems attending prior art IC active filters.

Another object of this invention is to provide a filter circuit whose cut-off frequency can be controlled easily, and which can be manufactured as an integrated circuit.

A further object of this invention is to provide a variable filter circuit whose cut-off frequency is controlled as a function of a control signal.

An additional object of this invention is to provide a filter circuit which exhibits a controllable cut-off frequency such that manufactured filters of different batches all can be controlled to exhibit substantially identical operating characteristics.

Yet another object of this invention is to provide an improved filter circuit whose operation is relatively unaffected by temperature.

A still further object of this invention is to provide a high-pass filter circuit whose cut-off frequency may be made desirably low.

Various other objects, advantages and features of the present invention will become readily apparent from the ensuing detailed description, and the novel features will be particularly pointed out in the appended claims.

SUMMARY OF THE INVENTION

In accordance with this invention, the filter circuit is provided with a first transistor whose base electrode is connected to an input terminal by a reactance element, such as a capacitor. Second and third transistors are connected in differential amplifier configuration and have their emitter electrodes coupled in common to a current source. The emitter and base electrodes of the first transistor are connected to the base and collector electrode respectively, of the second transistor. An output terminal is connected to at least one of the collector and emitter electrodes of the first transistor. Various embodiments of the filter circuit are disclosed, including the use of the filter circuit in a controllable oscillator, as a phase shifter, and as a hue control circuit for a color television receiver.

BRIEF DESCRIPTION OF THE DRAWINGS

The following detailed description, given by way of example, will best be understood in conjunction with the accompanying drawings in which.

DETAILED DESCRIPTION OF PREFERRED EMBODIMENTS

Figure 1:
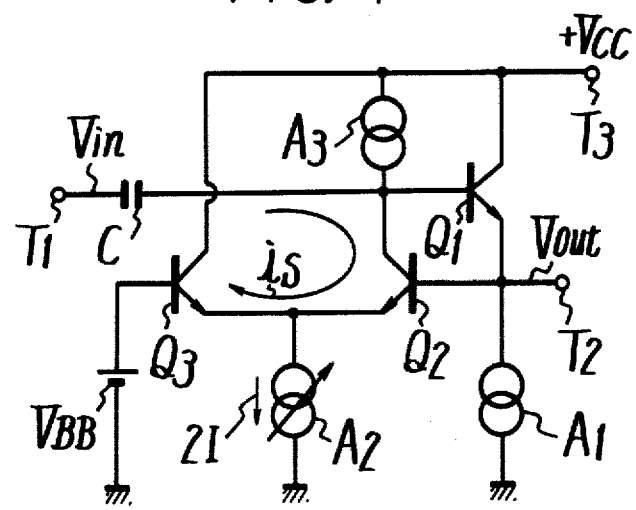
FIGS. 1-10 are schematic representations of various embodiments of the filter circuit in accordance with the present invention.

Referring now to the drawings, wherein like reference numerals are used throughout, and in particular to FIG. 1, there is illustrated a basic embodiment of a filter circuit in accordance with the teachings of the present invention. The circuit shown herein is comprised of transistors $Q_1$, $Q_2$ and $Q_3$. The base electrode of transistor $Q_1$ is connected to an input terminal $T_1$ by a reactance element, shown herein as a capacitor C. It will be appreciated that, if desired, other reactive elements, such as an inductance, may be used in place of capacitor C. The emitter electrode of transistor $Q_1$ is connected to a reference potential, such as ground, by a current source $A_1$. The emitter electrode also is connected to an output terminal $T_2$.

Transistors $Q_2$ and $Q_3$ are connected in differential amplifier configuration with their emitter electrodes connected in common. The common connection of these emitter electrodes is coupled to ground by a controllable current source $A_2$. The base electrode of transistor $Q_2$ is connected to the emitter electrode of transistor $Q_1$, and the collector electrode of transistor $Q_2$ is connected to the base electrode of transistor $Q_1$. A current source $A_3$ also is connected to the collector electrode of transistor $Q_2$. A bias voltage source $V_{BB}$ is connected to the base electrode of transistor $Q_3$. Finally, the collector electrodes of transistors $Q_1$ and $Q_3$ are connected to a terminal $T_3$ supplied with an operating potential $+V_{cc}$.

In operation, let it be assumed that the input voltage applied to terminal $T_1$ is represented as $V_{in}$, and let it be further assumed that the output voltage provided at the terminal $T_2$, that is, at the emitter electrode of transistor $Q_1$, is represented as $V_{out}$. With current source $A_1$ connected to the emitter electrode of transistor $Q_1$, it is appreciated that this transistor exhibits an emitter-follower configuration. Hence, if the base-emitter voltage drop across this transistor is neglected, the voltage at the base electrode thereof is substantially equal to the voltage at the emitter electrode thereof. Thus, the voltage provided at the base electrode of transistor $Q_1$ is substantially equal to $V_{out}$.

Let it be assumed that the angular frequency of the voltage provided at the terminal $T_1$ is represented as $\omega$. As a result of this signal, a signal current $i_s$ flows through capacitor C. This signal current may be represented as:

$$i_s = \frac{V_{in} - V_{out}}{1/j\omega C}. \quad (1)$$

It is seen that the voltage provided at the emitter electrode of transistor $Q_1$ is applied to the base electrode of transistor $Q_2$. The signal current $i_s$ flows through the collector-emitter circuit of transistor $Q_2$ in response to this voltage $V_{out}$. This signal current also flows through the collector-emitter circuit of transistor $Q_3$. This signal current may be determined by the voltage drop from the base electrode of transistor $Q_2$ to the base electrode of transistor $Q_3$. Since the voltage provided at the base electrode of transistor $Q_3$ is assumed herein to be the bias voltage $V_{BB}$, it is appreciated that, for an AC signal, the AC voltage across the base electrodes of transistors $Q_2$ and $Q_3$ is equal to $V_{out}$. The resistance in this AC path traversed by signal current $i_s$ is equal to the emitter resistance of each of transistors $Q_2$ and $Q_3$. If this emitter resistance is assumed to be equal and is represented as $r_e$, then the signal current $i_s$ flowing in the loop formed by transistor $Q_2$ and $Q_3$ is equal to the voltage difference between the base electrode of transistor $Q_2$ and the base electrode of transistor $Q_3$, divided by the emitter resistance in this circuit. Thus, signal current $i_s$ may be expressed as:

$$\frac{V_{out}}{r_e + r_e} = i_s. \quad (2)$$

The transfer function $H(\omega)$ of the filter shown in FIG. 1 is equal to the output voltage divided by the input voltage. From equations (1) and (2), this transfer function may be expressed as:

$$H(\omega) = V_{out}/V_{in} \quad (3)$$

$$H(\omega) = \frac{j\omega 2Cr_e}{1 + j\omega 2Cr_e}.$$

The transfer function expressed in equation (3) indicates that the filter circuit of FIG. 1 functions as a high-pass filter whose cut-off frequency $\omega_c$ may be represented as:

$$\omega_c = \tfrac{1}{2}Cr_e \quad (4)$$

Now, if the current which flows through current source $A_2$ is represented as 2I, then, since the emitter currents of transistors $Q_2$ and $Q_3$ are equal, the emitter current of each transistor is equal to I. The emitter resistance $r_e$ is related to the emitter current I in each of transistors $Q_2$ and $Q_3$ in accordance with the following expression:

$$r_e = kT/cI \quad (5),$$

wherein k is the Boltzmann constant, T is absolute temperature and q is the charge of an electron.

If equation (5) is substituted into equations (3) and (4), then the transfer function $H(\omega)$ and the filter cut-off frequency $\omega_c$ may be rewritten as:

$$H(\omega) = \frac{j\omega \cdot \frac{2kT}{q} \cdot \frac{C}{I}}{1 + j\omega \cdot \frac{2kT}{q} \cdot \frac{C}{I}} \quad (6)$$

$$\omega_c = \frac{q}{2kT} \cdot \frac{I}{C}. \quad (7)$$

It is, therefore, appreciated that the cut-off frequency of the high-pass filter shown in FIG. 1 can be changed, or controlled as a function of the magnitude of the current flowing through current source $A_2$. Various embodiments of current source circuits are known to those of ordinary skill in the art, and an example thereof is described in greater detail below. Since the current through a current source may be controlled by a suitable control signal, it is further recognized that the operating characteristics, that is, the transfer function and cut-off frequency of the filter circuit illustrated in FIG. 1 may be controlled in response to such a control signal. Consequently, since the cut-off frequency is established as a function of the current I, as is apparent from equation (7), and since this current can be controlled easily, the cut-off frequency $\omega_c$ from one filter circuit to another may be suitably controlled so as to be uniform. Furthermore, even though equation (7) represents that the cut-off frequency is dependent upon temperature T, it is appreciated that this temperature dependency can be cancelled by suitably controlling current I. For example, if the temperature increases, the current may be increased, in response to the aforementioned control signal, so as to balance, or cancel, any effect upon the cut-off frequency attributed to this change in temperature.

Another advantage of the circuit shown in FIG. 1 is that, even though the capacitance of capacitor C may be limited by reason of state-of-the-art integrated circuit fabrication techniques, the cut-off frequency $\omega_c$ may be made as low as desired merely be reducing the current I. Thus, it is seen that the embodiment shown in FIG. 1 overcomes the aforenoted disadvantages of prior art IC active filters and that the present invention is capable of providing high-pass filters of uniform cut-off frequency, of good temperature immunity and of low cut-off frequencies, as desired. Also, since the cut-off frequency is determined by the current of current source $A_2$, the cut-off frequency can be varied rapidly over a relatively wide range merely by controlling the current source. That is, as the current I changes, the cut-off frequency changes in the corresponding manner.

Yet another advantage of the embodiment shown in FIG. 1 is that the output impedance thereof is determined by the output impedance of transistor $Q_1$. It is appreciated that this output impedance is relatively low so that the illustrated filter circuit can be connected to other circuits without undesired leading effects. Hence, this circuit may be incorporated easily in a multi-stage device.

The signal current $i_s$ is, of course, a function of the input voltage $V_{in}$. As this signal current varies, the emitter resistance $r_e$ of each of transistors $Q_2$ and $Q_3$ also may vary. However, in view of the differential amplifier configuration of these transistors, it should be recognized that such variations in the emitter resistances thereof are in opposite directions. That is, if the emitter resistance of one transistor increases by reason of signal current $i_s$, the emitter resistance of the other transistor decreases. Consequently, such a change in the emitter resistances because of a change in the signal current has a cancelling effect. As a result thereof, the apparent change in emitter resistance $r_e$ caused by signal current $i_s$ is negligible. This means that the illustrative filter circuit exhibits a good distortion factor and a wide dynamic range.

Figure 2:
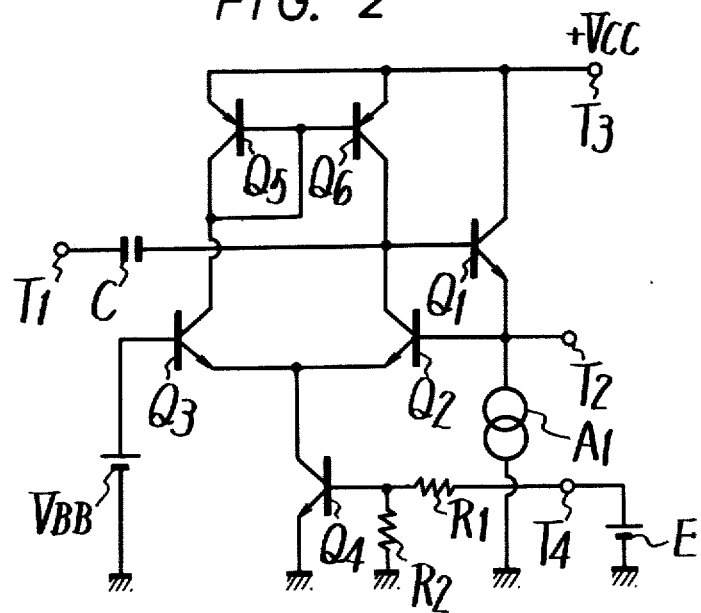

Another embodiment of the present invention is illustrated in FIG. 2. This embodiment differs from that shown in FIG. 1 in that current source A$_3$, which is coupled to the collector electrode of transistor Q$_2$, is constituted by a transistor Q$_6$ which is connected to a transistor Q$_5$ in a current mirror circuit configuration. Also, in the embodiment of FIG. 2, a particular example of current source A$_2$ is illustrated as comprising transistor Q$_4$ whose base electrode is supplied with a control voltage E via a voltage divider circuit formed of resistors R$_1$ and R$_2$. Control voltage E is applied to a terminal T$_4$ which, in turn, is connected to the voltage divider circuit.

When a current mirror circuit is used as current source A$_3$, as shown in FIG. 2, signal current i$_s$ through capacitor C is doubled. That is, because of this current mirror circuit, signal current i$_s$ exhibits twice the value in FIG. 2 than in FIG. 1 for the same input voltage V$_{in}$. Consequently, the cut-off frequency $\omega_c$ for the embodiment of FIG. 2 is twice the cut-off frequency for the embodiment of FIG. 1, and may be expressed as:

$$\omega_C = q/kT \cdot I/C \qquad (8)$$

Of course, if control voltage E is varied, the collector current of transistor Q$_4$ is varied in response thereto. Hence, a change in the control voltage results in a change in current I so as to vary or adjust the cut-off frequency $\omega_c$.

From equation (8), it is seen that the cut-off frequency is dependent upon temperature T. For example, if the temperature increases, it would appear that the cut-off frequency $\omega_c$ decreases. However, in the embodiment of FIG. 2, since current source A$_2$ is constituted by transistor Q$_4$, it is recognized that the increase in temperature T results in an increase in the collector current of transistor Q$_4$. This means that, as temperature T changes, current I in equation (8) changes in a similar manner. Consequently, any dependency of the cut-off frequency on temperature is cancelled. That is, a reduction in the cut-off frequency caused by an increase in temperature is cancelled because current I also increases by a corresponding amount. Thus, in practice, the cut-off frequency $\omega_c$ is not temperature dependent to any significant extent and, therefore, the temperature characteristic of the illustrated filter circuit is improved over the prior art.

Figure 3:
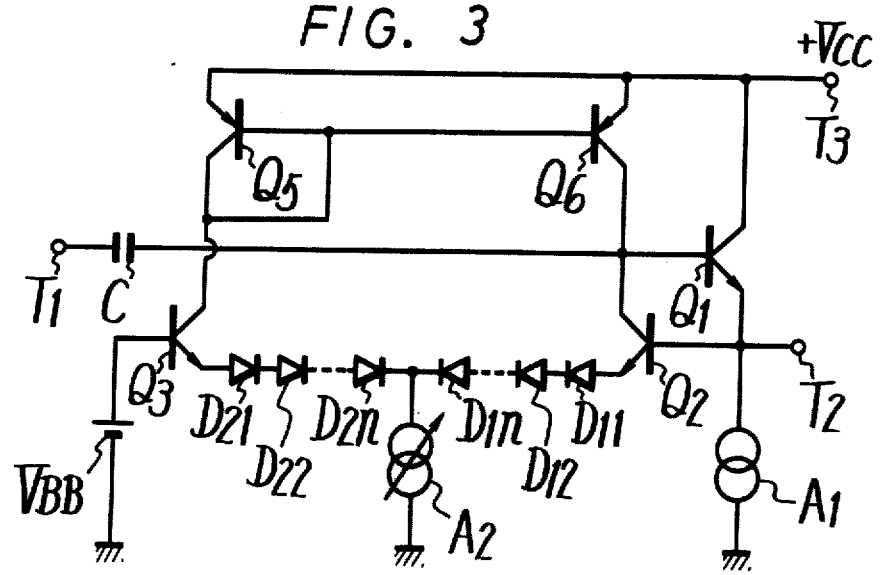

Another embodiment of the present invention is illustrated in FIG. 3. This embodiment differs from that described above with respect to FIG. 2 in that current source A$_2$ is not specified as being of any specific construction, although it may, of course, be constructed as shown in FIG. 2; and in that a series of n diodes is connected in the emitter circuit of transistor Q$_2$ and a series of n diodes is connected in the emitter circuit of transistor Q$_3$. As shown specifically, diodes D$_{11}$, D$_{12}$, . . . D$_{1n}$ are connected in series between the emitter electrode of transistor Q$_2$ and current source A$_2$. Similarly, diodes D$_{21}$, D$_{22}$, . . . D$_{2n}$ are connected in series between the emitter electrode of transistor Q$_3$ and the current source. Each diode exhibits a resistance r$_e$. That is, the resistance of each diode is equal to the emitter resistance of transistor Q$_2$ (and also transistor Q$_3$). This equal resistance may be attained easily in accordance with conventional integrated circuit manufacturing techniques. Hence, the effective resistance between the base electrode of transistor Q$_2$ and current source A$_2$ is equal to (n+1) r$_e$. Similarly, the effective resistance between current source A$_2$ and the base electrode of transistor Q$_3$ is equal to (n+1) r$_e$. Thus, in the embodiment shown in FIG. 3, the resistance in the path traversed by signal current i$_s$ is equal to 2(n+1) r$_e$. With this value of resistance, the derivation of the mathematical expression for cut-off frequency $\omega_c$ results in the following:

$$\omega_C = \frac{q}{kT} \cdot \frac{I}{(n+1)C} \qquad (9)$$

A comparison of equations (8) and (9) indicates that the cut-off frequency $\omega_c$ for the embodiment of the filter circuit shown in FIG. 3 will, for equal currents I and for equal capacitance C, be lower than the cut-off frequency for the embodiment of the filter circuit shown in FIG. 2. That is, the cut-off frequency for the embodiment shown in FIG. 3 is 1/(n+1) the cut-off frequency for the embodiment of FIG. 2. It is appreciated that if the cut-off frequency is to be the same for both embodiments, then the current I in equation (9) must be (n+1) times as great as the current I in equation (8). If the magnitude of the current I relative to the magnitude of signal current i$_s$ is large, as in the FIG. 3 embodiment, the dynamic range of the filter circuit is increased. Thus, for equal cut-off frequencies, the dynamic range of the embodiment shown in FIG. 3 is wider than the dynamic range of the embodiment shown in FIG. 2.

Figure 4:
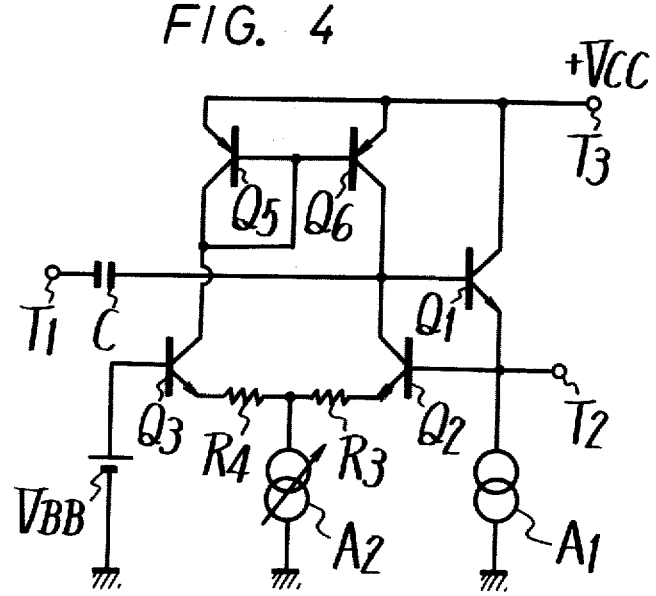

Referring now to the embodiment shown in FIG. 4, it is recognized that this embodiment is substantially similar to that described above with respect to FIG. 3, except that the diode resistances (n+1) r$_e$ of the FIG. 3 embodiment are replaced by ohmic resistances R$_3$ and R$_4$ in the FIG. 4 embodiment. Hence, the FIG. 4 embodiment attains substantially the same results and exhibits substantially the same effects as the FIG. 3 embodiment. That is, for the same value of current I, and for the same value of capacitance C, the cut-off frequency for the embodiment of FIG. 4 is substantially reduced relative to the cut-off frequency for the embodiment of FIG. 2, dependent upon the values of resistances R$_3$ and R$_4$. Also, if the cut-off frequency $\omega_c$ for the embodiment of FIG. 4 is to be equal to the cut-off frequency for the embodiment of FIG. 2, then the current I in the FIG. 4 embodiment is relatively large as compared to its signal current i$_s$. Hence, the dynamic range of the FIG. 4 embodiment is wider than the dynamic range of the FIG. 2 embodiment.

Figure 5:
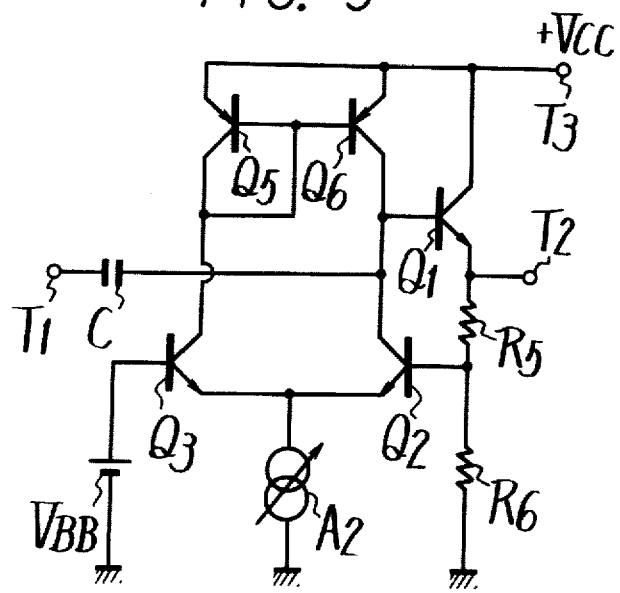

In all of the aforedescribed embodiments, the output voltage V$_{out}$ provided at the emitter electrode of transistor Q$_1$ is fed back substantially in its entirety (that is, approximately 100 percent of the output voltage is fed back) to the base electrode of transistor Q$_2$. In the embodiment of FIG. 5, current source A$_1$ is formed by series-connected resistors R$_5$ and R$_6$ which, as is known, serve as a current source if the resistors exhibit a sufficiently high resistance value. In addition to functioning as a current source, resistors R$_5$ and R$_6$ serve as a voltage divider. Thus, a voltage-divided portion of output voltage V$_{out}$ provided at the emitter electrode of transistor Q$_1$, which transistor is connected in emitter-follower configuration, is applied to the base electrode of transistor Q$_2$. The voltage dividing ratio K is equal to R$_6$/(R$_5$+R$_6$). Accordingly, the voltage which is fed back to the base electrode of transistor Q$_2$ is equal to KV$_{out}$.

Since only a portion of the output voltage is fed back to the base electrode of transistor $Q_2$, the transfer function $H(\omega)$ and the cut-off frequency $\omega_c$ of the illustrated filter circuit both are functions of this ratio K. The transfer function and the cut-off frequency may, therefore, be expressed as follows:

$$H(\omega) = \frac{1}{K} \cdot \frac{j\omega \cdot \frac{kT}{q} \cdot \frac{C}{I}}{1 + j\omega \cdot \frac{kT}{q} \cdot \frac{C}{KI}} \tag{10}$$

$$\omega_C = \frac{q}{kT} \cdot \frac{KI}{C} \tag{11}$$

From equation (11), it is recognized that, in accordance with the embodiment shown in FIG. 5, the cut-off frequency $\omega_c$ is reduced by an amount determined by the voltage-dividing ratio K relative to the embodiment discussed above with respect to FIG. 2. If, in the FIG. 5 embodiment, the cut-off frequency is to be equal to that of the FIG. 2 embodiment, then, from equation (11), it is appreciated that current I must be increased. Hence, the dynamic range of the FIG. 5 embodiment will be wider than that of the FIG. 2 embodiment.

Figure 6:
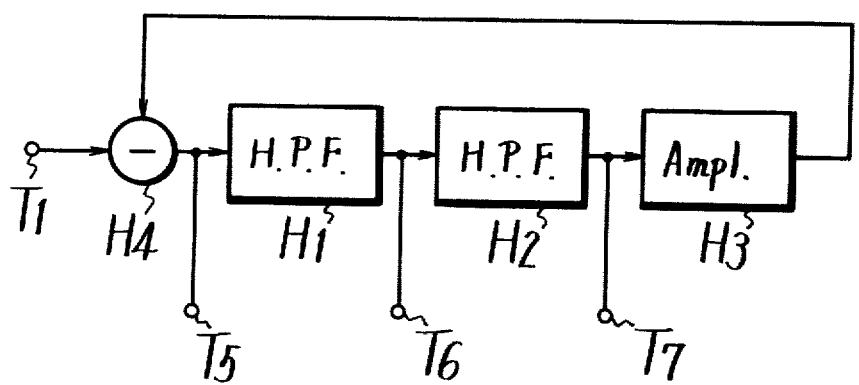

FIG. 6 represents a filter circuit which is constructed of two cascaded high-pass filter circuits $H_1$ and $H_2$ which may be of the construction described hereinabove with respect to the embodiments of FIGS. 1–5. In the filter circuit of FIG. 6, the output terminal of filter $H_1$ is connected to the input terminal of filter $H_2$, and also to an output terminal $T_6$. The output terminal of filter $H_2$ is connected to an amplifier $H_3$ and also to an output terminal $T_7$. Amplifier $H_3$ feeds back a filtered signal to a subtracting circuit $H_4$, the latter also being connected to input terminal $T_1$ to receive an input signal to be filtered. The output of subtracting circuit $H_4$, which is equal to the difference between the input signal and the fed back amplified signal, is supplied to filter $H_1$ and also to an output terminal $T_5$.

Let it be assumed that the cut-off frequency of high-pass filter $H_1$ is less than the cut-off frequency of high-pass filter $H_2$. If subtracting circuit $H_4$ is omitted, for the moment, then the lower frequencies of the input signal supplied to input terminal $T_1$ are filtered out by high-pass filter $H_1$. Thus, a higher frequency signal is passed by filter $H_1$ to high-pass filter $H_2$. Since the cut-off frequency of filter $H_2$ is assumed to be higher than that of filter $H_1$, the lower frequencies of the filtered signal supplied to filter $H_2$ are removed. Thus, amplifier $H_3$ is supplied with a higher frequency signal, the original lower frequencies of which having been filtered out.

Now, when subtracting circuit $H_4$ is considered, it is appreciated that the higher frequency signal which is provided at the output of amplifier $H_3$ is subtracted from the original input signal supplied to input terminal $T_1$. Thus, subtracting circuit $H_4$ effectively subtracts, or cancels, the higher frequency signals from the original input signal. Consequently, output terminal $T_5$ is provided with a low frequency signal which, of course, is the difference signal between the input signal and the higher frequency signal that is subtracted from the input signal.

High-pass filter $H_1$ removes the lower frequency from the signal provided at the output of subtracting circuit $H_4$. Thus, output terminal $T_6$ is provided with a lower frequency signal whose lower frequencies are removed, thereby resulting in a band-pass filtered signal.

Thus, the filter circuit illustrated in FIG. 6 functions both as a low-pass filter to supply a low-pass filtered signal at output terminal $T_5$; and also as a band-pass filter to supply a bandpass filtered signal at output terminal $T_6$.

Figure 7:
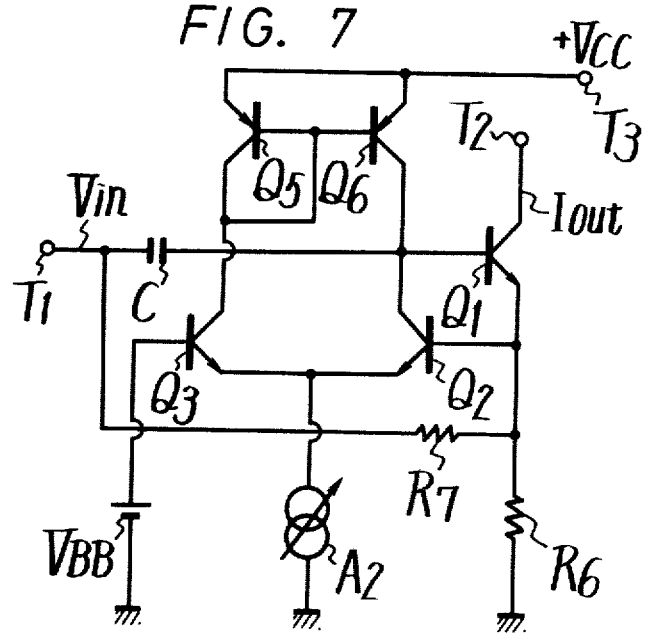

In another embodiment of the filter circuit in accordance with the present invention is illustrated in FIG. 7. This embodiment differs from that shown in FIG. 2 primarily in that input terminal $T_1$ is coupled to the emitter electrode of transistor $Q_1$ by a resistor $R_7$. Also, the current source coupled to the common-connected emitter electrodes of transistors $Q_2$ and $Q_3$, and shown as transistor $Q_4$ in FIG. 2, is shown generally as current source $A_2$ in FIG. 7. Furthermore, current source $A_1$ connected to the emitter electrode of transistor $Q_1$ in FIG. 2 is shown in FIG. 7 as resistor $R_6$.

If the output terminal $T_2$ of the filter circuit shown in FIG. 7 is connected to the collector electrode of transistor $Q_1$, it will be recognized that the collector current of this transistor, which is the output current $I_{out}$ of the filter circuit, is phase-shifted relative to the input signal. Assuming that $R_6 = R_7$, the output current $I_{out}$ is a function of the combination of the signal current $i_s$ through capacitor C and the current through resistor $R_7$. The reactance in the current path traversed by signal current $i_s$ results in a phase-shift between this current and the current to resistor $R_7$. Since the signal current $i_s$ may be varied by varying the current through current source $A_2$, it is seen that the phase of the output current $i_s$ will be varied as a function of this current source. Thus, the phase of the output current may be varied, or controlled, by a suitable control signal which determines the current $2I$ through current source $A_2$.

More particularly, if $R_6 = R_7 = P$, and if the emitter voltage of transistor Q, still is assumed to be $V_{out}$, then the signal (or AC) current flowing through resistor $R_6$ may be expressed as $V_{out}/R$. Similarly, the AC current flowing through resistor $R_7$ may be expressed as $$\frac{V_{out} - V_{in}}{R}.$$

Hence, the total emitter current of transistor $Q_1$ is $$\frac{V_{out}}{R} + \frac{V_{out} - V_{in}}{R}, \text{ or } \frac{1}{R}(2V_{out} - V_{in}).$$

This can be rewritten as $$\frac{1}{R} \frac{(2V_{out} - 1)}{V_{in}} V_{in}.$$

Now, $$\frac{V_{out}}{V_{in}} = H(\omega).$$

From equations (1) and (2), with the recognition that the signal current $i_s$ for the FIG. 7 embodiment is twice the signal current for the FIG. 1 embodiment because of the use of the current mirror circuit, the transfer function $H(\omega)$ may be expressed as:

$$H(\omega) = \frac{j\omega r_e C}{1 + j\omega r_e C}$$

Thus, the total emitter current, which is substantially equal to the collector current $I_{out}$ for transistor $Q_1$, is found to be:

$$I_{out} = \frac{1}{R}(2H(\omega) - 1)V_{in}$$

$$= -\frac{1}{R}\left(\frac{1 - j\omega r_e C}{1 + j\omega r_e C}\right)V_{in}$$

$$= -\frac{1}{R}\left(\frac{1 - 2j\omega r_e C - \omega^2 r_e^2 C^2}{1 + \omega^2 r_e^2 C^2}\right)V_{in}$$

$$= -\frac{1}{R} \cdot \frac{1}{1 + \omega^2 r_e^2 C^2}\left\{(1 - \omega^2 r_e^2 C^2) - j(2\omega r_e C)\right\}V_{in}$$

The amplitude characteristic of the output current $I_{out}$ is, $$A = \frac{1}{1 + \omega^2 r_e^2 C^2}\sqrt{(1 - \omega^2 r_e^2 C^2) + 4\omega^2 r_e^2 C^2}$$

$$= 1.$$

Thus, the amplitude characteristic is constant.

The phase characteristic $\theta$ of the output current $I_{out}$ is, $$\theta = \sin^{-1}\omega r_e C$$

$$= \sin^{-1}\omega C \frac{kT}{e} \cdot \frac{1}{I}$$

In the foregoing expressions, the term $V_{in}/R$ is equal to the input current. Since $A=1$, the output current $I_{out}$ is seen to have the same amplitude as that of the input current, because $$I_{out} = A \cdot I_{in}$$

$$= I_{in}.$$

Hence, the output current amplitude remains constant even if the current through current source $A_2$ varies. But the phase $\theta$ of the output current $I_{out}$ is varied relative to the phase of the input current as a function of the current I, that is, as a function of the current through current source $A_2$.

Figure 8:
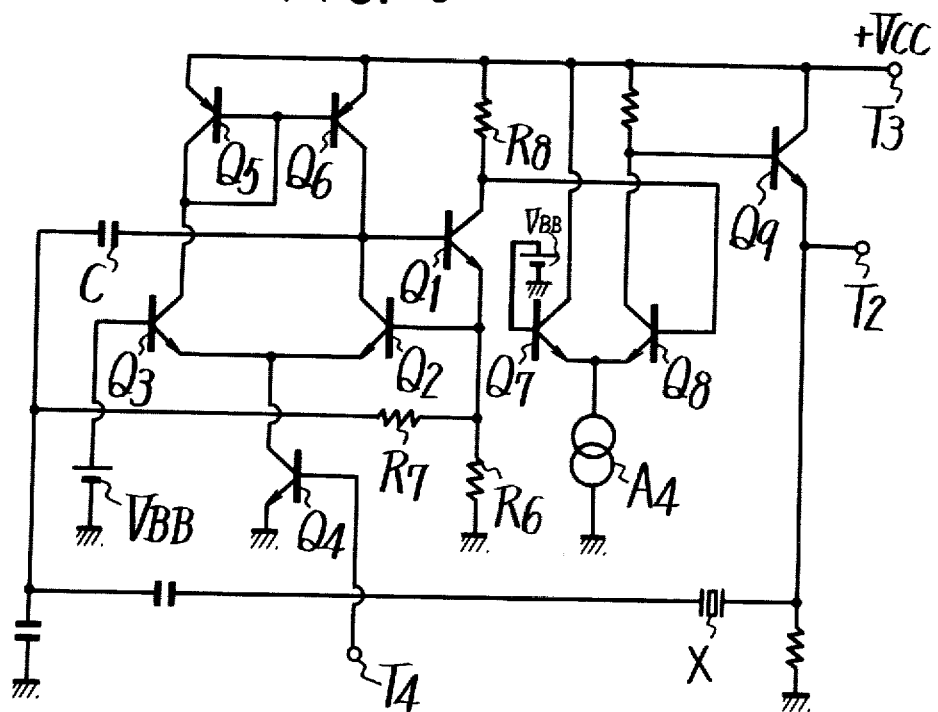

Yet another embodiment of the present invention is illustrated in FIG. 8 wherein the filter circuit described in FIG. 7 is connected to a crystal oscillator so as to form, in combination therewith, a voltage controlled oscillator (VCO) or, as is sometimes referred to by those of ordinary skill in the art, a variable crystal oscillator (VXO). More particularly, the output terminal of the phase shift circuit of FIG. 7, that is, the collector electrode of transistor $Q_1$, is connected to the oscillating circuit formed of transistors $Q_7$, $Q_8$ and $Q_9$, and crystal element X. Transistors $Q_7$ and $Q_8$ are connected in differential amplifier configuration. The emitter electrodes of these transistors are connected in common to a current source $A_4$. The base electrode of transistor $Q_7$ is connected to receive a bias potential equal to the bias potential at the base electrode of transistor $Q_8$, thereby maintaining the differential amplifier in balance. The base electrode of transistor $Q_8$ is connected to the collector electrode of transistor $Q_1$ to receive a phase-shifted voltage therefrom corresponding to the afore-described output voltage $I_{out}$. The output from this differential amplifier configuration is derived from the collector electrode of transistor $Q_8$ and is supplied, via emitter-follower transistor $Q_9$, to crystal element X. The output of this crystal element is AC coupled via a capacitor to the input terminal of the phase shift circuit, that is, to capacitor C. The output terminal $T_2$ of the variable crystal oscillator is connected to the emitter electrode of transistor $Q_9$.

It is seen that current source $A_2$ in FIG. 7 is constituted by transistor $Q_4$ in FIG. 8, the base electrode of this transistor being coupled to a control input $T_4$ to receive a control signal. The resistor $R_8$ in the collector circuit of transistor $Q_1$ ($R_8 = R_6$) provides a phase-shifted voltage at the collector electrode of transistor $Q_1$, which phase shift is a function of the control signal applied to terminal $T_4$. This has been discussed in detail above.

Crystal element X is of the type which produces an oscillating signal of a frequency that is determined by the phase of the signal supplied thereto. That is, if the oscillating signal produced by crystal element X is fed back thereto through a controllable phase shift circuit, the frequency of the oscillating signal will vary with the phase shift. Further, if an AC signal whose frequency is equal to the center frequency of the crystal element is applied thereto, the oscillating signal produced by the crystal element in response thereto will be of the center frequency and will be in phase (i.e. zero phase shift) with the applied AC signal. If the input signal frequency increases above the center frequency, the phase of the output oscillating signal is advanced; and, conversely, if the input signal frequency decreases below the center frequency, the phase of the output oscillating signal is retarded.

Now, the capacitor through which the oscillating signal produced by crystal element X is supplied to the input of the phase shift circuit, imparts a phase advance of $+90°$. If the control signal applied to terminal $T_4$ produces a phase shift of $-90°$, the $+90°$ phase advance is cancelled and the input and output signals of crystal element X are in phase with each other. Hence, the crystal oscillator produces an oscillating signal at the center frequency of crystal element X. If the control signal at terminal $T_4$ produces a phase shift of $-75°$, the phase of the AC signal supplied to the input of crystal element X relative to the phase of the oscillating signal at its output, is equal to $+90° - 75° = +15°$. This means that the output signal is phase-shifted by $-15°$ relative to the input signal of the crystal element. Consequently, the frequency of the oscillating signal produced by crystal element X is reduced from the center frequency, and this reduced frequency signal at the output of the crystal element is in phase with the reduced frequency signal at the input thereof. Conversely, if the control signal at terminal $T_4$ produces a phase shift of $-105°$, the phase of the AC signal supplied to the input of crystal element X relative to the phase of the oscillating signal at its output, is equal to $+90° - 105° = -15°$. This results in an output signal that is phase shifted by $+15°$ relative to the input signal of the crystal element. Therefore, the frequency of the oscillating signal produced by crystal element X is increased over the center frequency.

Control of the phase shift circuit, and thus, the frequency of the crystal oscillator, is attained by the control signal applied to terminal $T_4$. The controlled, variable frequency oscillating signal is derived at output terminal $T_2$ which, it is seen, is connected to the input of crystal element X. Of course, this output terminal may be connected to other locations in the illustrated circuit, as desired.

Figure 9:
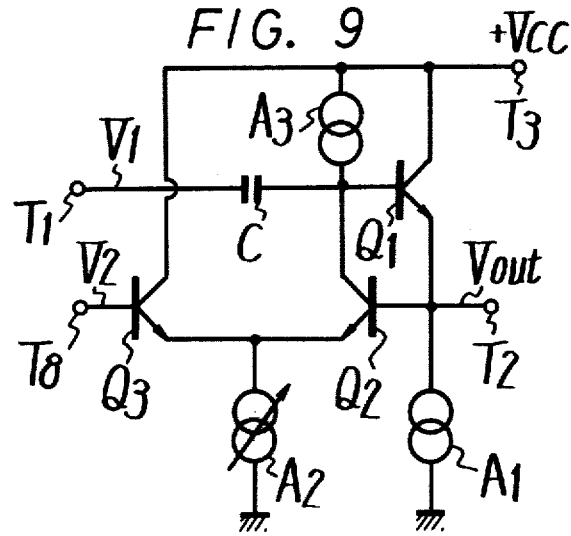

Referring now to FIG. 9, there is illustrated a modification of the embodiment described above with respect to FIG. 1. In this modified embodiment, the base electrode of transistor $Q_3$ is connected to an input terminal $T_8$ for receiving an input signal $V_2$. This differs from the previously described embodiment wherein the base electrode of transistor $Q_3$ is supplied with a bias voltage $V_{BB}$. If input terminal $T_1$ is supplied with the input signal $V_1$, then the signal path traversed by signal current $i_s$ is formed of input terminal $T_1$, capacitor C and the emitter resistances $r_e$ of transistors $Q_2$ and $Q_3$ to input terminal $T_8$. The signal current $i_s$ through capacitor C is equal to the signal current $i_s$ through the emitter resistances of transistors $Q_2$ and $Q_3$ and may be expressed as:

$$i_s = \frac{V_1 - V_{out}}{\frac{1}{j\omega_c}} = \frac{V_{out} - V_2}{2r_e} \quad (12)$$

The terms in equation (12) can be rearranged so as to solve for the output voltage $V_{out}$ as follows:

$$V_{out} = \frac{2r_e}{\frac{1}{j\omega C} + 2r_e} \cdot V_1 + \frac{\frac{1}{j\omega C}}{\frac{1}{j\omega C} + 2r_e} \cdot V_2, \quad (13)$$

$$= \frac{j\omega \cdot \frac{CR}{1}}{1 + j\omega \cdot \frac{CR}{1}} \cdot V_1 + \frac{1}{1 + j\omega \cdot \frac{CR}{1}} \cdot V_2, \quad (14)$$

wherein $R = 2kT/q$.

The first term in equation (14) represents that the filter circuit shown in FIG. 9 exhibits high-pass characteristics in response to the input voltage $V_1$ supplied to input terminal $T_1$. The second term in equation (14) represents that the filter circuit exhibits low-pass characteristics in response to the input voltage $V_2$ supplied to input terminal $T_8$. The cut-off frequency for the high-pass characteristic is equal to the cut-off frequency for the low-pass characteristic. These cut-off frequencies are controlled as a function of the current 2I through current source $A_2$.

If it is assumed that $V_1 = -V_2$, then the transfer function $H(\omega)$ for the filter circuit shown in FIG. 9 may be expressed as:

$$H(\omega) = \frac{1 - j\omega \cdot \frac{CR}{1}}{1 + j\omega \cdot \frac{CR}{1}} \quad (15)$$

The transfer function of equation (15) is seen to have a variable phase that is a function of the current I. Thus, the embodiment of FIG. 9 functions as a controllable phase shift circuit when $V_1 = -V_2$ the amount of phase shift being controlled by the current 2I through current source $A_2$.

Figure 10:
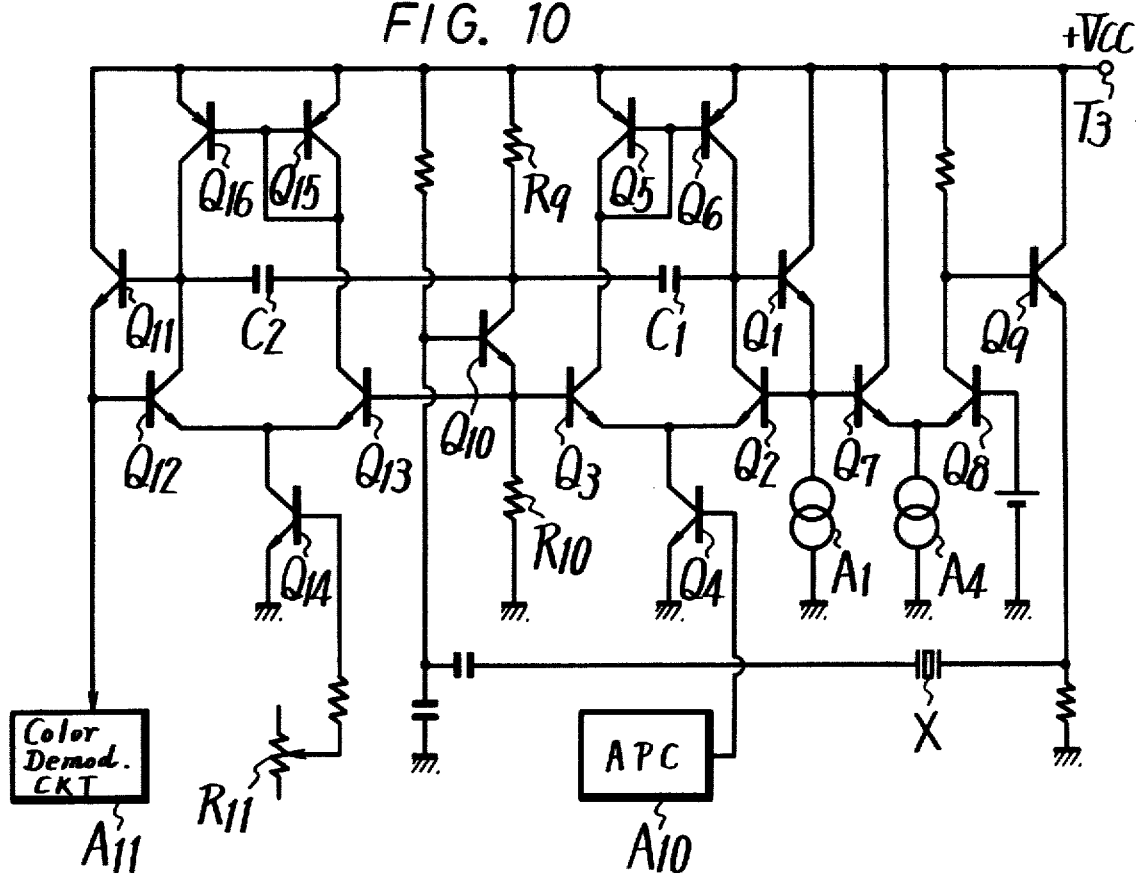

The embodiment of FIG. 9 can be combined with a crystal oscillator of the type described previously with respect to FIG. 8 and also can be combined with another, similar phase shift circuit so as to form a hue control circuit which finds ready application in a color television receiver. Such a hue control circuit is illustrated in FIG. 10. In this embodiment, current source $A_2$ is constituted by current source transistor $Q_4$ whose base electrode is supplied with an automatic phase control (APC) signal derived from an APC circuit $A_{10}$. Furthermore, current source $A_3$, shown in FIG. 9, is constituted by the current mirror circuit formed of transistors $Q_5$ and $Q_6$, described above with respect to the embodiment of FIG. 2. The output of the phase shift circuit, that is, the emitter electrode of transistor $Q_1$, is connected to the crystal oscillator formed of transistors $Q_7$–$Q_9$ and crystal element X. In this crystal oscillator, the base electrode of transistor $Q_8$ is supplied with a bias voltage and, in this regard, differs from the crystal oscillator shown in FIG. 8 wherein the base electrode of transistor $Q_8$ is connected to the collector electrode of transistor $Q_1$.

The oscillating signal produced by crystal element X is AC coupled to the base electrode of a phase-splitting transistor $Q_{10}$. This transistor has its collector electrode connected to power supply terminal $T_3$ by a resistor $R_9$ and its emitter electrode connected to ground by a resistor $R_{10}$. The emitter electrode of transistor $Q_{10}$ is connected to the base electrode of transistor $Q_3$, and the collector electrode of transistor $Q_{10}$ is connected to capacitor $C_1$. Hence, it is appreciated that the voltages which are supplied to capacitor $C_1$ and to transistor $Q_3$, that is, voltages $V_1$ and $V_2$ (discussed above with respect to the embodiment of FIG. 9) are equal and opposite to each other. Thus, the circuit formed of transistors $Q_1$–$Q_6$ functions as a controllable phase shift circuit similar to that described in FIG. 9, and the amount of phase shift imparted by this circuit is determined by the APC voltage applied to current source transistor $Q_4$. As mentioned with respect to the embodiment of FIG. 8, the frequency of the oscillating signal produced by the crystal oscillator is controlled in accordance with the amount of phase shift imparted by the phase shift circuit. That is, the frequency of the oscillating signal provided at the output of crystal element X is controlled by the APC voltage applied to transistor $Q_4$ which, in turn, controls the phase shift imparted by the phase shift circuit.

Transistors $Q_{11}$–$Q_{16}$ are connected in a manner similar to that of transistors $Q_1$–$Q_6$ and, therefore, form another phase shift circuit. The capacitor $C_2$ in this phase shift circuit is connected to the collector electrode of transistor $Q_{10}$, and the base electrode of transistor $Q_{13}$ is connected to the emitter electrode of transistor $Q_{10}$. Consequently, in the example assumed hereinabove, the voltages which are supplied to capacitor $C_2$ and to transistor $Q_{13}$ are similar to voltages $V_1$ and $V_2$ of FIG. 9, and are equal but opposite to each other. The output of this second phase shift circuit is derived from the emitter electrode of transistor $Q_{11}$ and is supplied as a reference signal to a demodulator $A_{11}$. The demodulator is included in a typical color television receiver.

A variable resistor $R_{11}$ is connected to the base electrode of transistor $Q_{14}$ to supply a base control signal thereto as a function of the setting of the variable resistor. This setting may be adjusted, as desired, by the viewer of the color television receiver.

In operation, the APC voltage provided by APC circuit $A_{10}$ is representative of the phase differential between the local oscillating signal normally provided in the color television receiver and the received burst signal, as is conventional. This APC voltage varies the phase shift imparted by the first phase shift circuit (formed of transistors $Q_1$–$Q_6$) so as to adjust the frequency of the oscillating signal generated by the crystal oscillator. Since the combination of this phase shift circuit and the crystal oscillator functions as a variable crystal oscillator (VXO), it is appreciated that the phase of the oscillating signal generated by the VXO is locked to the burst signal by the APC voltage. This phase-locked oscillating signal is supplied, via the second phase shift circuit, to the color demodulator $A_{11}$. Since the phase of the oscillating signal which is supplied as a reference signal to the color demodulator may be varied as a function of the setting of variable resistor $R_{11}$, it will be recognized that the hue of the reproduced video picture may be varied, as desired, by the viewer because it is the phase of the reference signal which determines the hue of the reproduced video picture.

It is appreciated that each of the filter circuits shown in the foregoing embodiments may be constructed as an integrated circuit. As is typical, an IC must be provided with external connecting terminals, or pads, by which it can be electrically connected to other circuitry. These connecting terminals have been shown, in the illustrated embodiments, as terminals $T_1$, $T_2$ . . . . The cost of construction of an IC is determined, to a large part, by the number of such external connecting terminals that must be provided. In the foregoing embodiments, the filter circuit is shown with a minimum number of connecting terminals. Hence, the present invention is readily adapted for low cost IC manufacturing.

While the present invention has been particularly shown and described with reference to various embodiments, it should be readily appreciated to those of ordinary skill in the art that various changes and modifications in form and detail may be made without departing from the spirit and scope of the invention. For example, although the reactance device used herein has been shown as a capacitor, it may, alternatively, be replaced by an inductor. If an inductive reactance device is used, the filter circuit exhibits low-pass characteristics.

Also, it is appreciated that, in the various embodiments described above, current source $A_3$ may be replaced by current mirror transistors $Q_5$ and $Q_6$, and vice versa. Furthermore, current source $A_1$ may be any conventional current source, such as a current source transistor, a relatively high resistance, or the like. Preferably, current source $A_2$ is formed as a current source transistor whose collector-emitter current is controlled by a suitable control signal.

It is intended that the foregoing, as well as various other changes and modifications, be included within the scope of the appended claims.

What is claimed is:

1. A filter circuit, comprising an input terminal for receiving an input signal; first transistor means having base, emitter and collector electrodes; reactance means connecting the base electrode of said first transistor means to said input terminal; second and third transistor means, each having base, emitter and collector electrodes, said second and third transistor means being connected in differential amplifier configuration and having their emitter electrodes coupled to a common connection; n diodes connected between the emitter electrode of each of said second and third transistor means and said common connection, respectively, current source means connected to said common connection; said first transistor means having its emitter electrode connected to the base electrode of said second transistor means and its base electrode connected to the collector electrode of said second transistor means; an additional current source connected to said emitter electrode of said first transistor means; and an output terminal connected to at least one of the collector and emitter electrodes of said first transistor means to provide an output signal.

2. The circuit of claim 1 wherein said reactance means comprises a capacitor.

3. The circuit of claim 1 or 2 wherein said first-mentioned current source means comprises a variable current source, whereby the cut-off frequency of said filter circuit is a function of the current produced by said current source.

4. The circuit of claim 3 further comprising a second additional current source connected to the collector electrode of said second transistor means.

5. The circuit of claim 4 further comprising a bias potential supplied to the base electrode of said third transistor means; and a source of operating potential coupled to the collector electrodes of said first and third transistor means.

6. The circuit of claim 1, wherein said output terminal is connected to the emitter electrode of said first transistor means.

* * * * *